United States Patent
Wang et al.

(10) Patent No.: US 6,875,285 B2
(45) Date of Patent: Apr. 5, 2005

(54) SYSTEM AND METHOD FOR DAMPENING HIGH PRESSURE IMPACT ON POROUS MATERIALS

(75) Inventors: Ching-Ya Wang, Hsin-Chu (TW); Ping Chuang, Hsin-Chu (TW); Yu-Liang Lin, Hsin-Chu (TW); Mei-Sheng Zhou, Hsin-Chu (TW); Henry Lo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 10/422,339

(22) Filed: Apr. 24, 2003

(65) Prior Publication Data

US 2004/0211440 A1 Oct. 28, 2004

(51) Int. Cl.⁷ .................................................. C23G 1/00
(52) U.S. Cl. ............................ 134/2; 134/25.4; 134/34; 134/36; 134/42
(58) Field of Search ............................ 134/2, 25.4, 34, 134/36, 42

(56) References Cited

U.S. PATENT DOCUMENTS

| | | | | |
|---|---|---|---|---|
| 4,474,994 A | * | 10/1984 | Makin | 568/436 |
| 5,369,033 A | * | 11/1994 | Di Milia et al. | 436/148 |
| 5,403,621 A | | 4/1995 | Jackson et al. | |
| 5,868,862 A | * | 2/1999 | Douglas et al. | 134/26 |
| 5,908,510 A | | 6/1999 | McCullough et al. | |
| 5,914,183 A | * | 6/1999 | Canham | 428/312.6 |
| 6,260,562 B1 | * | 7/2001 | Morinishi et al. | 134/57 R |
| 6,440,337 B1 | * | 8/2002 | Hanna et al. | 264/11 |
| 6,486,078 B1 | * | 11/2002 | Rangarajan et al. | 438/778 |
| 2003/0033676 A1 | * | 2/2003 | DeYoung et al. | 8/158 |
| 2003/0116176 A1 | * | 6/2003 | Rothman et al. | 134/1.3 |

* cited by examiner

Primary Examiner—Sharidan Carrillo
(74) Attorney, Agent, or Firm—Slater & Matsil, L.L.P.

(57) ABSTRACT

System and method for reducing damage to a semiconductor substrate when using cleaning fluids at elevated pressures to clean the semiconductor substrates. A preferred embodiment comprises applying the cleaning fluid at a first pressure for a first time period, wherein the first pressure is relatively low, and then increasing the pressure of the cleaning fluid to a pressure level that can effectively clean the semiconductor substrate and maintaining the pressure level for a second time period. The application of the cleaning fluid at the relatively low initial pressure acts as a temporary filler and creates a buffer of the cleaning fluid on the semiconductor substrate and helps to dampen the impact of the subsequent high pressure application of the cleaning fluid on the semiconductor substrate.

14 Claims, 8 Drawing Sheets

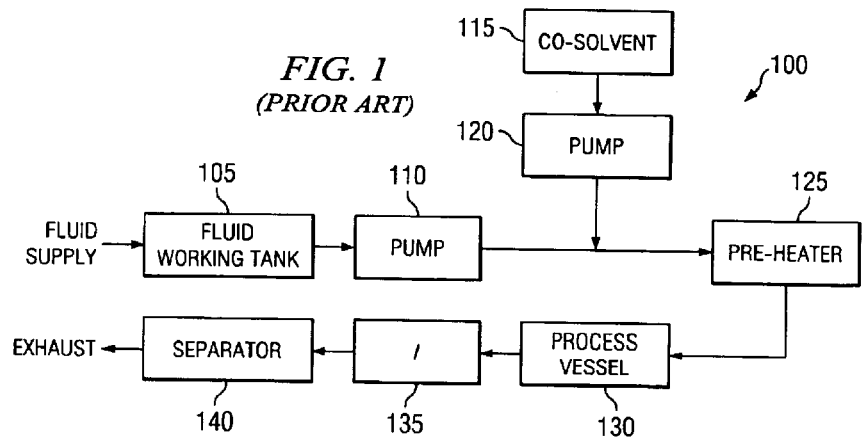

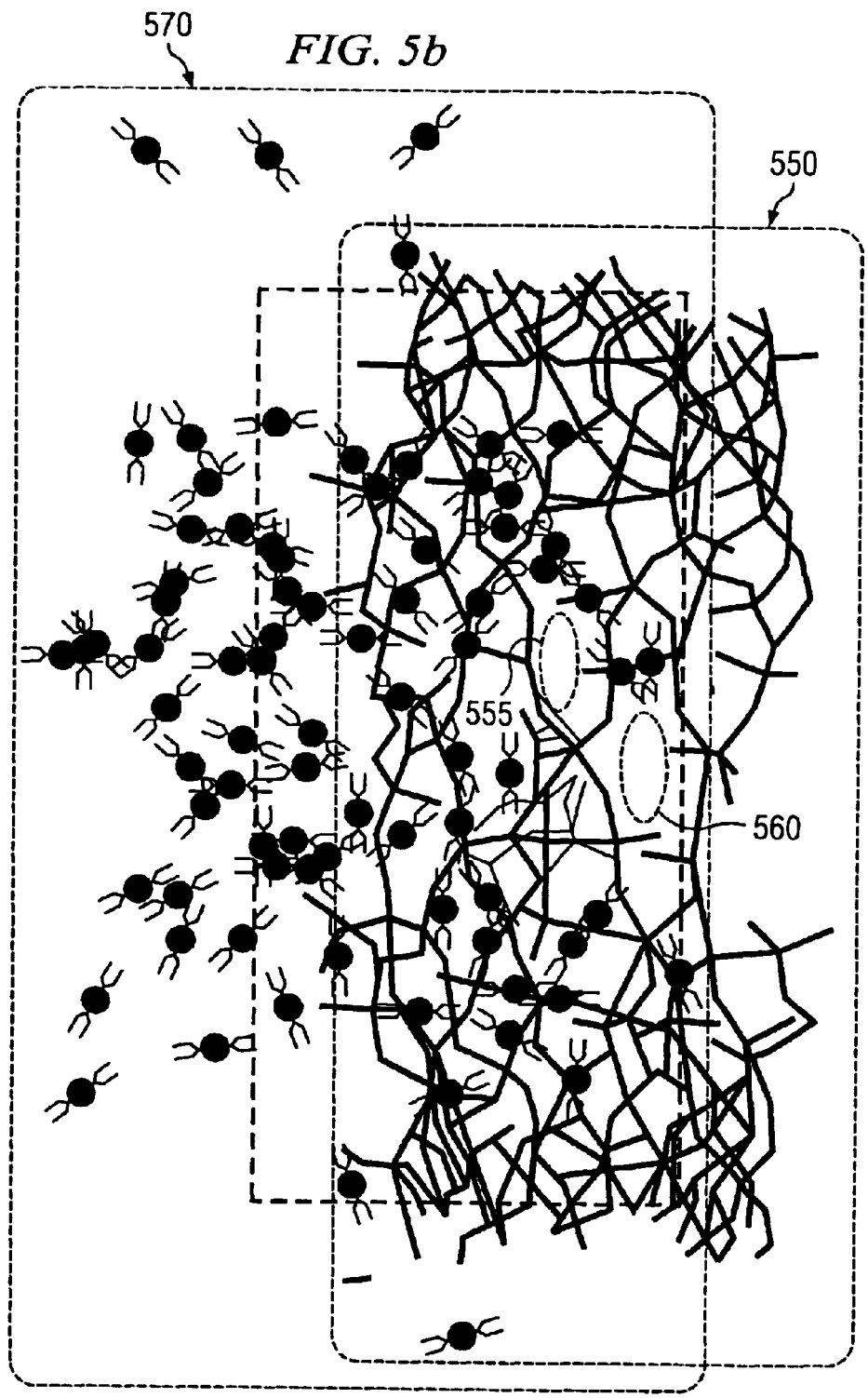

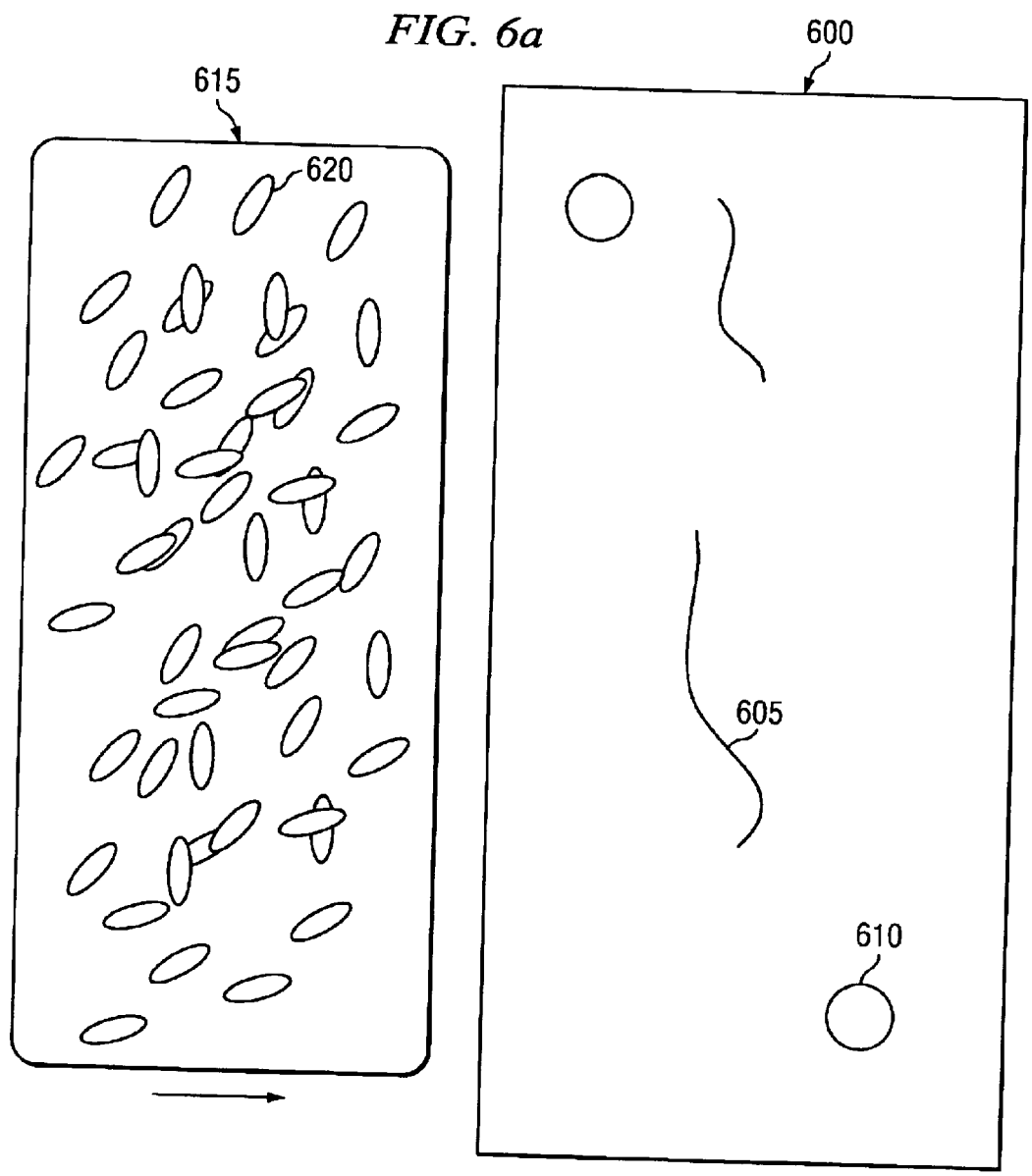

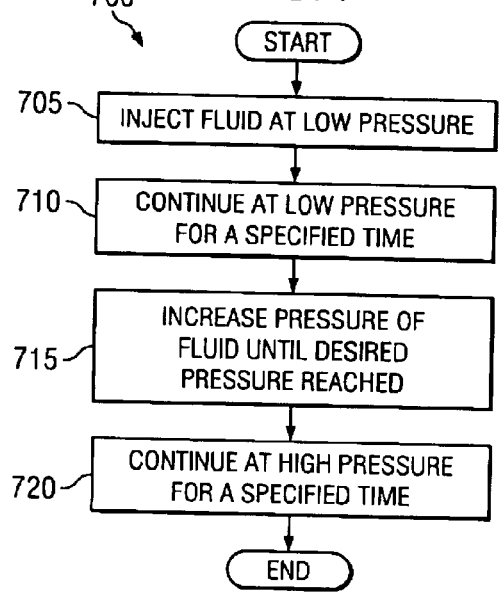
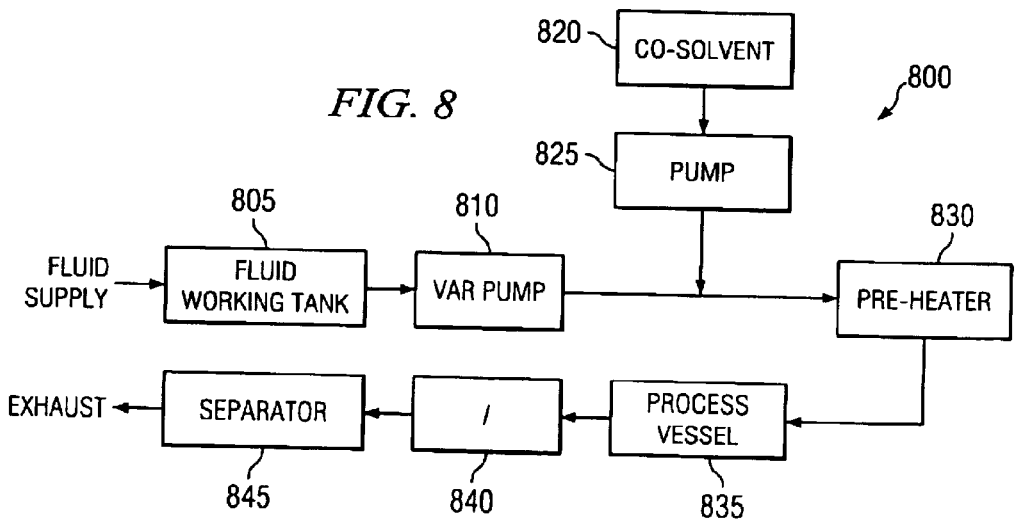

SYSTEM AND METHOD FOR DAMPENING HIGH PRESSURE IMPACT ON POROUS MATERIALS

TECHNICAL FIELD

The present invention relates generally to a system and method for semiconductor wafer fabrication, and more particularly to a system and method for reducing damage on semiconductor wafers incurred during high pressure residue cleaning using cleaning fluids.

BACKGROUND

Generally, integrated circuits (IC) are fabricated on a relatively hard semiconductor substrate, such as silicon (Si), gallium arsenide (GaAs), and others. These relatively hard semiconductor substrates, when properly prepared, can be made to be extremely smooth. The smoothness of the semiconductor substrates (or simply substrate) is one of the primary factors in determining the manufacturing process that can be used on the substrate, i.e., the density or feature size of the manufacturing process. The smoothness (or roughness) of a substrate can be specified numerically, usually a number indicating an average dimension of various pores, valleys, pits, cracks, and other imperfections on the substrate. If a substrate is relatively rough, then fabricating ICs with feature sizes that are smaller than the average dimensions of the imperfections on the substrate will likely yield a large number of defects in the ICs.

The defects in the IC will likely be due to the imperfections in the substrate not permitting the proper formation of the structures of the IC. For example, during the formation of conductive lines (using conductors such as aluminum or copper along with other possibly conductive materials) in a valley or crack in the surface of the semiconductor may result in the conductive material flowing into unintended areas. The conductor in the valley (or crack) can then cause an electrical short circuit with other portions of the IC. The short circuit could then prevent the IC from operating as intended. In addition to short circuits, imperfections can cause breaks in a conductive line, resulting in an electrical open circuit. Imperfections in the substrate can also result in certain desired features being malformed and hence not likely to operate as intended.

A move is being made in the semiconductor industry towards substrate materials with low dielectric (low k) coefficients. These low k substrates, such as substrates made from a combination of an organic substance (or substances) with silicon, tend to be soft and/or fragile. Additionally, they can be more sensitive to heat and pressure than silicon (and other hard semiconductor substrates). Furthermore, the k-value of these low k substrates can be affected by the size and number of pores in the substrate. Therefore, should the size and number of pores in a low k substrate be modified in some fashion, the k-value of the substrate may be changed. This can have a detrimental effect on the desired properties of the substrate.

A common step in the fabrication of an IC on a semiconductor substrate involves the cleaning of the substrate at various points in the fabrication process. The cleaning step can be used to eliminate residue from the previous (or several previous) fabrication steps from the substrate. For example, the cleaning step can remove post-etched and/or post-ashed residue from the substrate. If these residues are left on the substrate, the k-value of the substrate may be altered and/or subsequent fabrication steps may not be able to be performed in an optimal manner due to contamination, perhaps resulting in defective ICs.

One way to clean a substrate is to use a supercritical fluid at high pressure. A supercritical fluid is any substance that is at a temperature and pressure that is above its critical temperature and critical pressure. Examples of supercritical fluids that can be used to clean substrates include but are not limited to: nitrogen, argon, xenon, carbon dioxide, propane, ammonia, methanol, water, and others. The supercritical fluid, injected onto the substrate at high pressure, can remove the unwanted material. Then, when the substrate is brought back down to normal pressures and temperatures, the supercritical fluid will typically leave very little (or no) residue on the substrate and the fabrication process may continue.

A disadvantage of the prior art is that the supercritical fluid is applied at high pressure, wherein the pressure must exceed the critical temperature and pressure of the fluid. The high pressure can create cracks, holes, and other imperfections in the substrate, especially if the substrate is made using a low k material that tends to be softer and more fragile than a typical semiconductor substrate. Additionally, the high pressure can enlarge and intensify existing imperfections in the substrate. Such damage to the semiconductor substrate may result in defective ICs.

SUMMARY OF THE INVENTION

These and other problems are generally solved or circumvented, and technical advantages are generally achieved, by preferred embodiments of the present invention which provide a system and method for reducing damage to semiconductor substrates due to a high pressure injection of supercritical fluids injected onto the semiconductor substrates during the fabrication of integrated circuits.

In accordance with a preferred embodiment of the present invention, a method for cleaning a semiconductor substrate comprising applying a cleaning fluid at a first pressure for a first time period and applying the cleaning fluid at a second pressure for a second time period. The second pressure is greater than the first pressure.

In accordance with another preferred embodiment of the present invention, a semiconductor substrate cleaner is provided. The semiconductor substrate cleaner includes a cleaning fluid pump coupled to a cleaning fluid working tank. The cleaning fluid pump applies a cleaning fluid at different pressure levels. A process vessel is coupled to the cleaning fluid pump to contain the semiconductor substrate while cleaning. The semiconductor substrate cleaner further includes an end-point detector coupled to the process vessel. The end-point detector determines when to stop the application of the cleaning fluid.

An advantage of a preferred embodiment of the present invention is that the application of the supercritical fluid at a low (lower) initial pressure may result in existing pores or other imperfections in the semiconductor substrate being infused with molecules of the supercritical fluid. This infusion can prevent the enlargement of the existing pores or imperfections in the semiconductor substrate and the crushing or squelching of the semiconductor substrate when a subsequent high pressure application of the supercritical fluid is performed.

An additional advantage of a preferred embodiment of the present invention is that the present invention requires little (or no) additional hardware to be added to the fabrication process. Therefore, very little (or no) retrofitting of the fabrication equipment is required and can be rapidly implemented.

A further advantage of a preferred embodiment of the present invention is that the reduction in damage to the semiconductor substrates is achieved through the use of materials already being used. Therefore, no (or very little) additional cost is required.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 is a diagram illustrating a prior art semiconductor substrate cleaner that uses supercritical fluids in the cleaning process;

FIG. 2 is a table displaying several selected supercritical fluids;

FIGS. 5a and 5b are diagrams illustrating microscopic views of a semiconductor substrate prior to and after the impact with a supercritical fluid at elevated pressure levels;

FIGS. 6a and 6b are diagrams illustrating idealized views of a semiconductor substrate prior to and after the impact with a supercritical fluid at elevated pressure levels;

FIG. 7 is a diagram showing a process for cleaning a semiconductor substrate with pressurized supercritical fluids while reducing damage to the semiconductor substrate by the supercritical fluids, according to a preferred embodiment of the present invention;

FIG. 8 is a diagram illustrating a semiconductor substrate cleaning processor for use in cleaning semiconductor substrates using supercritical fluids, wherein the supercritical fluids may be injected at a variety of pressure levels, according to a preferred embodiment of the present invention.

DETAILED DESCRIPTION OF ILLUSTRATIVE EMBODIMENTS

Figure 4:
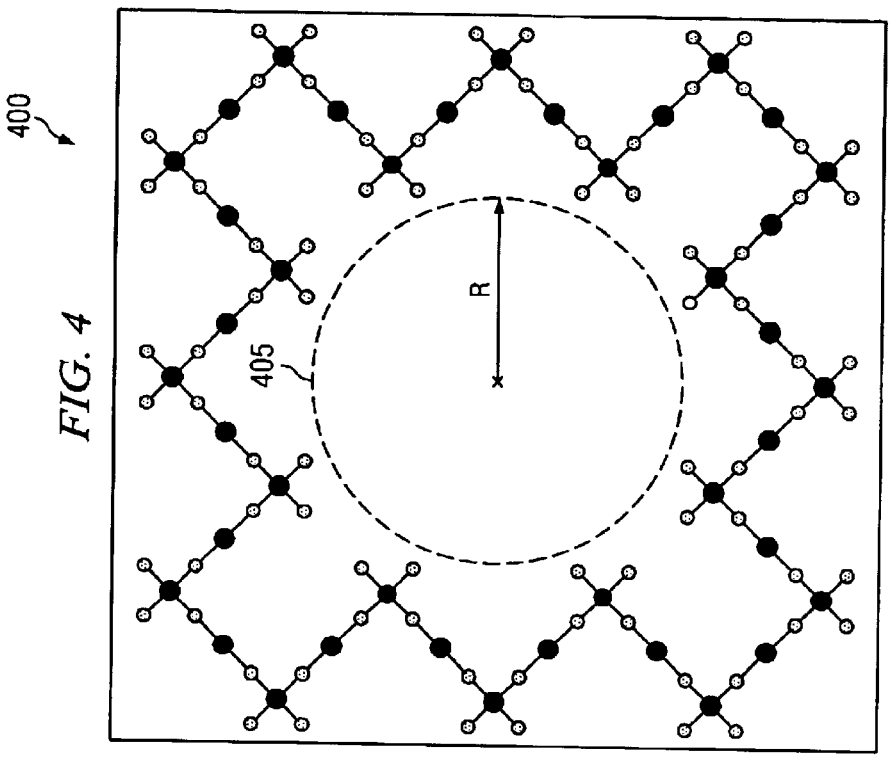
FIG. 4 is a diagram illustrating a microscopic view of a portion of a semiconductor substrate.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor fabrication plant making use of semiconductor substrates that may be soft and/or fragile and using supercritical fluids to clean the semiconductor substrates. The invention may also be applied, however, to other semiconductor fabrication situations that are using fluids injected at high pressures to prepare a surface, and other manufacturing and construction situations where an initial application of a fluid at high pressure may lead to damage to a surface to which it is being applied.

With reference now to FIG. 1, there is shown a prior art semiconductor substrate cleaning processor 100 for use in cleaning semiconductor substrates using supercritical fluids. Typically, semiconductor substrates need to be kept as clean and free of contamination as much as possible. To achieve a desired level of cleanliness, it may be necessary to apply the supercritical fluids at high pressure. As discussed above, a supercritical fluid is simply a fluid that is at a higher pressure and temperature than its critical temperature and pressure. A list of some supercritical fluids and their respective critical pressures and temperatures is shown below.

The substrate cleaning processor 100 uses a supercritical fluid that is stored in a fluid working tank 105. The fluid working tank 105 is itself supplied with the supercritical fluid via a fluid supply. The supercritical fluid, stored in the fluid working tank 105, is then pumped by a pump unit 110. The pump unit 110 can supply the critical fluid at a desired pressure. Also part of the substrate cleaning processor is a co-solvent tank 115 and a co-solvent pump 120. The co-solvent, stored in the co-solvent tank 115, may be a chemical that may be added to the supercritical fluid to help modify the certain properties (such as solubility) of the supercritical fluid so that the supercritical fluid's cleaning capability is enhanced.

A pre-heater 125 is available if there is a need to heat either the supercritical fluid (provided at a given pressure by the pump 110) or the co-solvent (again, provided at a given pressure by the pump 120) or both to a temperature that is above room temperature. The pressurized and perhaps heated supercritical fluid is then provided to a process vessel 130. The process vessel 130 holds the semiconductor substrate(s) to be cleaned. The process vessel 130 may be as simple as a cauldron with a fixable lid that can be removed to insert and extract the semiconductor substrate or it may be more complex, featuring a hydraulic (or pneumatic) wall that may be opened to insert and extract the semiconductor substrate.

Once the lid (or wall) of the process vessel 130 is fixed in position, the pressurized supercritical fluid is injected onto the semiconductor substrate. The pressurized supercritical fluid effectively cleans fabrication residue from the semiconductor substrate. After a predetermined amount of time, the pressurized supercritical fluid stream is stopped and the now clean semiconductor substrate is removed from the process vessel 130. The amount of time that the pressurized supercritical fluid stream is applied onto the semiconductor substrate can be dependent on a variety of factors, including but not limited to: the permeability of the supercritical fluid with respect to the material of the semiconductor substrate which may be related to the pore size and the material type of the semiconductor substrate, the type of residue the cleaning is expected to remove, the type of materials to remain on the semiconductor substrate, and so forth.

However, time may not be the only determining factor on the duration of the pressurized supercritical fluid stream. For example, the pressurized supercritical fluid may be stopped after a certain amount (volume) of the supercritical fluid has been applied onto the semiconductor substrate.

Coupled to the process vessel 130 is an end-point detection device 135. The end-point detection device 135 may measure the amount of time that has expired since the beginning of the injection of the pressurized supercritical fluid stream or it may measure the volume of the injected pressurized supercritical fluid. The end-point detection device 135 may be coupled to an output outlet of the process vessel 130 that permits the exiting of the pressurized supercritical fluid.

As it exits the process vessel 130, the pressurized supercritical fluid is collected in a separator 140. The separator 140 may be used to filter the supercritical fluid to extract the residue material removed from the semiconductor substrate from the supercritical fluid or the co-solvent from the supercritical fluid. The spent supercritical fluid can then be exhausted into the environment if it is not harmful to the environment and if it is not feasible to reuse the supercritical fluid. If it is possible to reuse the supercritical fluid, then the spent supercritical fluid may be collected in a collection tank (not shown) to be reprocessed for reuse. If the supercritical can not be reused but is harmful to the environment, the spent supercritical fluid may be collected in a collection tank (not shown) to be properly disposed of at a later time.

With reference now to FIG. 2, there is shown a table 200 listing selected supercritical fluids along with their critical temperatures and pressures. The selected supercritical fluids listed in table 200 are commonly used in semiconductor fabrication, with perhaps carbon dioxide being the most commonly used.

A relatively new type of semiconductor substrate, commonly referred to as low k substrates, is starting to become widely used in the industry. The k refers to materials dielectric constant. Substrates made from low k materials may have lower RC switching delays. These substrates tend to be mechanically softer and more porous than traditional substrate materials such as silicon dioxide. The material's softness and porosity can make them more vulnerable to damage than the traditional substrate materials during the fabrication process. Additionally, a substrate's k-value may be changed by changing the number of pores or the size of the pores in the substrate. For example, a substrate's k-value may be lowered by increasing either the number of pores or the size of the pores (or both) in the substrate. These pores may be filled with contaminants during the fabrication process and affect the substrate's k-value, hence, possibly negating a reason for using the low k substrate.

Figure 3:
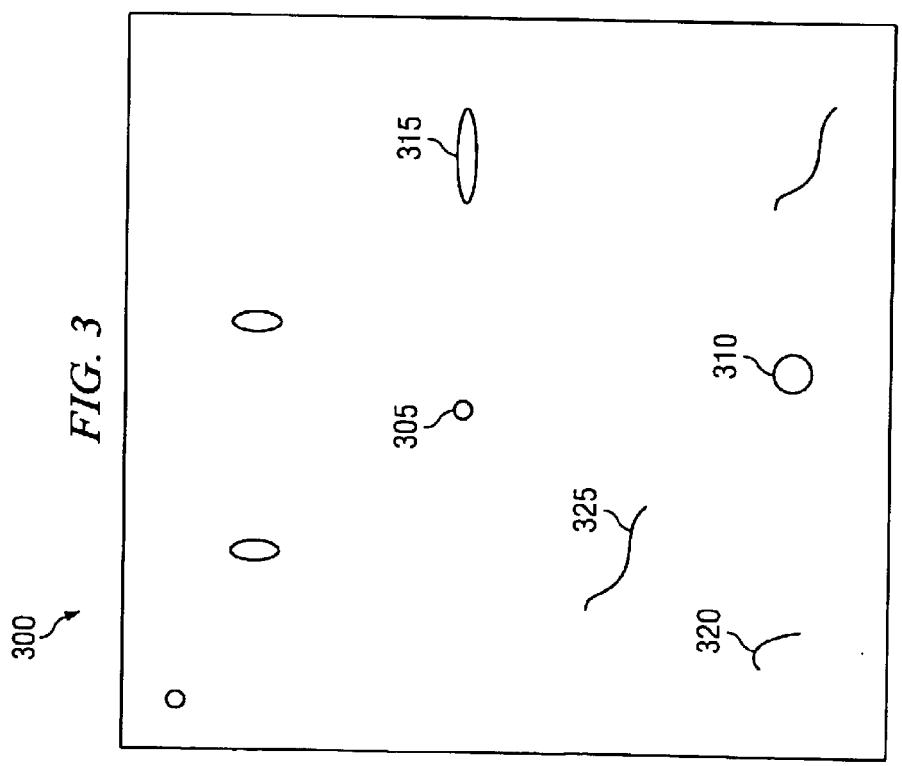
FIG. 3 is a diagram illustrating a top view of a semiconductor substrate with imperfections.

With reference now to FIG. 3, there is shown a top view of a semiconductor substrate 300, wherein the semiconductor substrate 300 has a number of pores and imperfections, and wherein the pores and imperfections are displayed in an idealized fashion. The pores and imperfections may be of differing sizes and dimensions (for example, pores 305, 310, and 315) and cracks of differing sizes and dimensions (for example, cracks 320 and 325). Note that as discussed above, pores may be distinguished from imperfections in that pores may be intentionally placed onto a substrate to affect (lower) the substrate's k-value while imperfections are an unwanted side-effect of the manufacture and handling of the substrate itself.

The semiconductor substrate 300 is an idealized substrate with perhaps a relatively large number of pores and imperfections, maybe more than what would be acceptable in practice. Pores can be thought of as basically holes in the material of the semiconductor substrate 300 that may be purposefully placed in the semiconductor substrate 300 to set a particular k-value, and may generally have the appearance of circles, ovals, or spheres (when internal to the surface). Cracks may be the result of imperfections in the crystalline structure of the semiconductor substrate 300 and may vary in direction and dimension. Note that pores and imperfections may appear on the surface of the semiconductor substrate 300 or they may be below the surface. Generally, surface defects tend to be more problematic to the fabrication process, but it is possible for some of the steps in the fabrication process to exacerbate sub-surface pores and imperfections and can cause certain sub-surface pores and imperfections to grow and become surface pores and imperfections. For example, open pores and imperfections at (or near) the surface of a low k substrate may cause subsequent integration problems in that they might exacerbate sub-surface pores and imperfections when high-pressure supercritical fluids are used to clean the substrates.

With reference now to FIG. 4, there is shown a microscopic view of a portion of a semiconductor substrate 400, showing the molecular structure of the semiconductor substrate 400 along with a pore 405. The pore 405 may have been intentionally formed using special techniques to specify a k-value of the semiconductor substrate 400. The pore 405 may be characterized by a specifying the dimension of a radius, R, drawn from its center. The dimensions of pores are typically specified from several nanometers to dozens of nanometers. A semiconductor substrate can be characterized and even marketed by its pore size. As above, the pore 405 may be on the surface of the semiconductor substrate 400 or it may be sub-surface or internal to the semiconductor substrate 400.

As discussed previously, a novel method for cleaning a semiconductor substrate during the fabrication process is to use a supercritical fluid, such as carbon dioxide, injected at high pressure onto the semiconductor substrate to clean the semiconductor substrate. Note that in order to use a supercritical fluid, the pressure should be greater than the critical pressure. For example, for carbon dioxide, the pressure should be greater than 1072 pounds per square inch (FIG. 2).

While the elevated pressures used during the cleaning process may not damage a semiconductor substrate made of a relatively hard material such as silicon, the elevated pressures can cause damage to a porous material such as a large variety of low k materials. The elevated pressures, especially when applied for an extended period of time, can enlarge existing pores and cracks in the semiconductor substrate, even create new cracks where there were not prior to the application of the supercritical fluid. If the semiconductor substrate is sufficiently fragile, the pressurized supercritical fluid may even cause squelch or crush the semiconductor substrate.

The size of a pore along with its location (such as surface, sub-surface, or interior), may have a significant effect on the amount of damage that the pressurized supercritical fluid may inflict upon the substrate. For example, a substrate with large pores will likely be more easily damaged by the supercritical fluid than a substrate with small pores. Furthermore, a substrate with relatively few surface and sub-surface pores may be more immune to damage from the supercritical fluid than a substrate with a large number of surface and sub-surface pores.

Figure 5A:
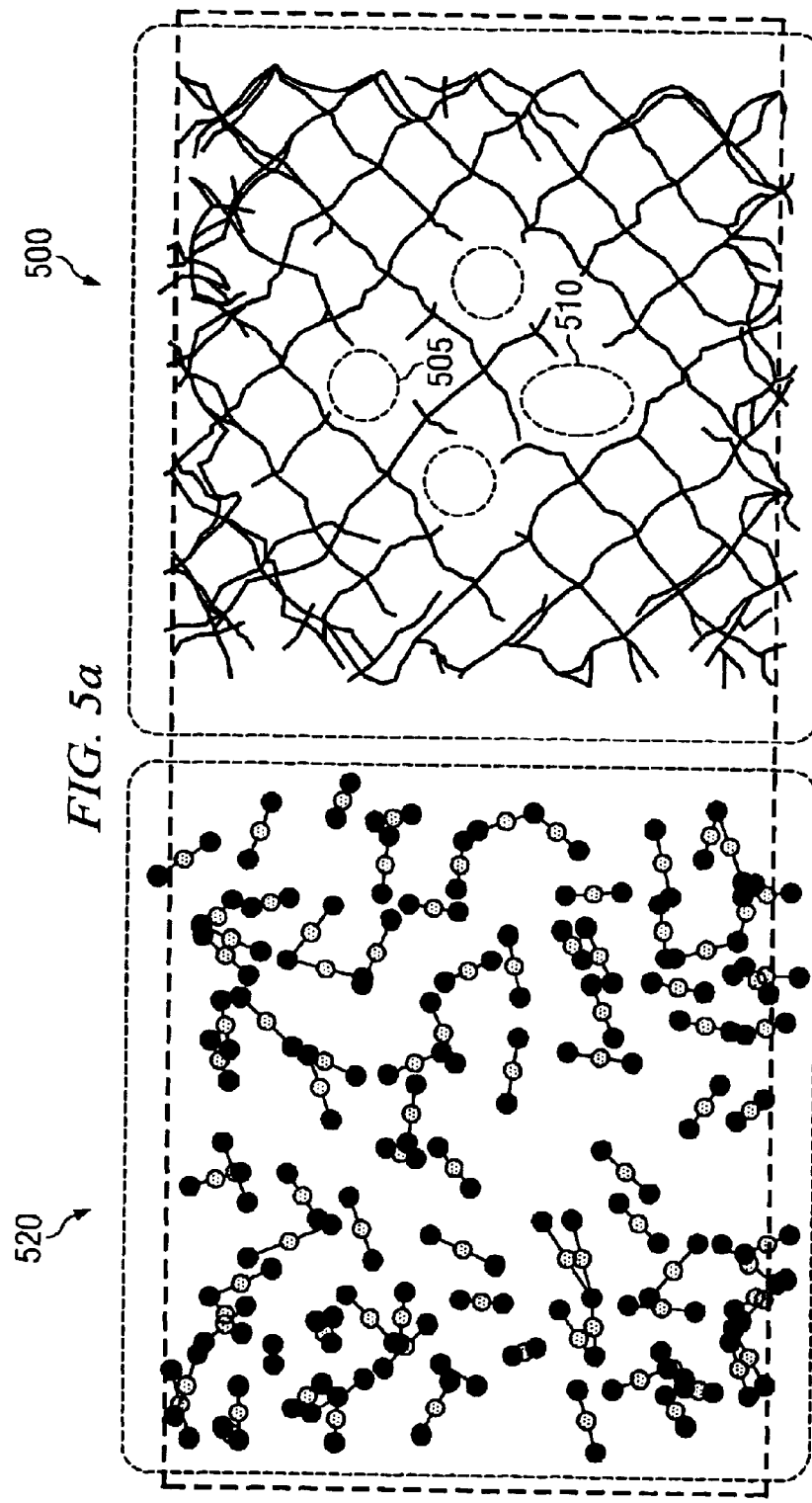

With reference now to FIG. 5a, there is shown a microscopic model displaying a semiconductor substrate 500 and molecules 520 of a supercritical fluid at a time immediate prior to the molecules 520 of the supercritical fluid impacting the semiconductor substrate 500, wherein the semiconductor substrate 500 is made from a porous and/or mechanically soft material. The semiconductor substrate 500 has several pores of various sizes in its interior (for example, pores 505 and 510).

With reference now to FIG. 5b, there is shown a microscopic model displaying a semiconductor substrate 550 and molecules 570 of a supercritical fluid at a time after the molecules has impacted the semiconductor substrate 550, wherein the semiconductor substrate 550 is made from a porous and/or mechanically soft material. The semiconductor substrate 550 may be representative of the semiconductor substrate 500 (FIG. 5a) after the impact with the high pressure supercritical fluid. The model shows that some of the molecules of the supercritical fluid, when injected at elevated pressure, have punched through the semiconductor substrate 550 and have damaged portions of the crystalline structure of the semiconductor substrate. Additionally, several pores (for example, pores 555 and 560 which may correspond to pores 505 and 510 (FIG. 5a)) have been enlarged and the substrate was significantly squelched. In general, when comparing the semiconductor substrate 550 with the semiconductor substrate 500 (FIG. 5a), it may be clear that the semiconductor substrate 550 has been compressed, with its crystalline structure damaged, and existing imperfections enlarged. It is likely that this semiconductor substrate will have a different k-value than it originally had.

Figure 6B:
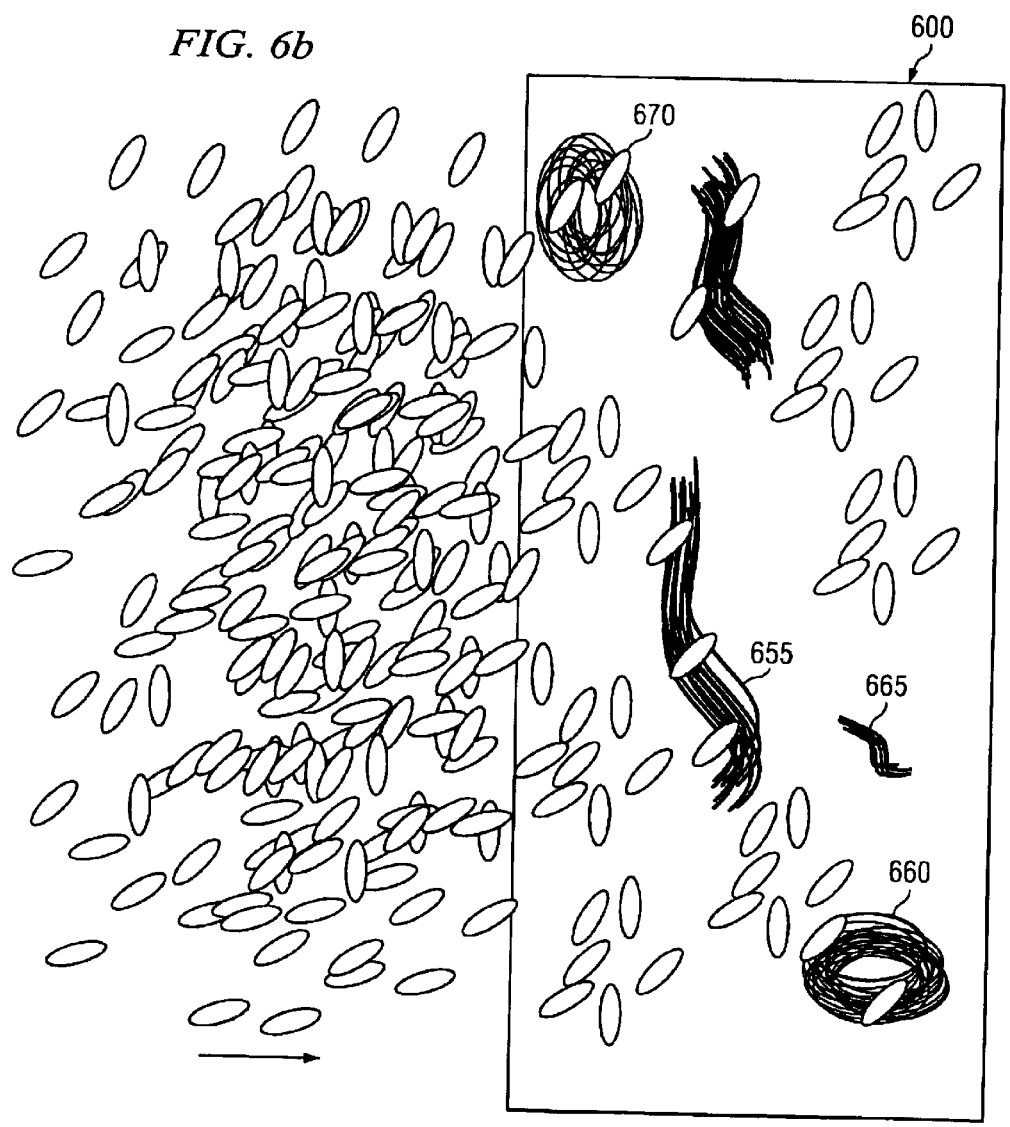

With reference now to FIGS. 6a and 6b, there are shown an idealized view immediately before and a period of time after an impact between molecules 615 of a supercritical fluid at elevated pressure and a semiconductor substrate 600, wherein the semiconductor substrate 600 is made from a porous and/or mechanically soft material. FIG. 6a shows the semiconductor substrate 600 with several cracks (for example, crack 605) and pores (for example, pore 610) prior to impact by molecules 615 (for example, molecule 620) of a pressurized supercritical fluid. The cracks and pores in the semiconductor substrate 600 may be on the surface of the semiconductor substrate 600 or in the interior of the semiconductor substrate 600.

While FIG. 6a shows the semiconductor substrate 600 immediately prior to impact, FIG. 6b shows the semiconductor substrate 600 a period of time after the impact of the pressurized supercritical fluid on the surface of the semiconductor substrate 600. The damaged caused by the pressurized supercritical fluid includes enlargement of existing cracks (for example, enlarged crack 655) and pores (for example, enlarged pore 660 and 670). Additionally, the pressurized supercritical fluid may cause new cracks (for example, new crack 665) to appear in the semiconductor substrate 600.

The damage caused by the pressurized supercritical fluid is likely to be the result of the impact of the molecules (for example, molecule 670) of the supercritical fluid impacting existing pores and imperfections in the semiconductor substrate 600. The creation of new cracks (for example, new crack 665) in the semiconductor substrate 600 may be the result of the impact of the molecules of the super critical fluid impacting a portion of the semiconductor substrate 600 that may be free of imperfections, but is not as mechanically strong as other portions of the semiconductor substrate 600. Note that it is likely that the amount of damage caused by the impact of the pressurized supercritical fluid may also vary with the amount of time that the supercritical fluid impacts upon the surface of the semiconductor substrate.

It is clear that the use of supercritical fluids at highly elevated pressure levels can result in damage to a semiconductor substrate, especially when the semiconductor substrate is made from a material that has low mechanical strength or if it is porous, such as materials with low dielectric constants (low k materials). As discussed previously, the amount of damage on a semiconductor substrate may be related to the amount of time that the pressurized supercritical fluid is applied on it. Therefore, if the amount of time of the application is minimized, then the resulting damage may be minimized as well. However, if the exposure time is shortened, then the semiconductor substrate may not be sufficiently cleaned because the supercritical fluid was not given adequate time to remove the impurities from the semiconductor substrate.

With reference now to FIG. 7, there is shown a flow diagram illustrating a process 700 for cleaning a semiconductor substrate with a pressurized supercritical fluid with reduced supercritical fluid induced damage, according to a preferred embodiment of the present invention. The cleaning process 700 begins with injecting a supercritical fluid onto a semiconductor substrate at a first pressure level (block 705), wherein the first pressure level may be relatively low. According to a preferred embodiment of the present invention, the fluid is carbon dioxide and the first pressure level is approximately 50 pounds per square inch (or 3.4 atmospheres of pressure). Note that the first pressure level can vary depending on several factors, including but not limited to: the mechanical hardness or toughness of the semiconductor substrate (the harder the semiconductor substrate, a greater first pressure may be permitted), the size of existing pores and imperfections on and in the semiconductor substrate (the smaller the size of the existing pores and imperfections, a greater first pressure may be permitted), the permeability of the supercritical fluid to the semiconductor substrate (the less the permeability, the a greater first pressure may be permitted), and so forth. Note also that even if the properties of the supercritical fluid and the semiconductor substrate may allow for a greater first pressure, if the resulting cleaning is sufficient, it may not be necessary to increase the first pressure.

After initializing the injection of the supercritical fluid onto the semiconductor substrate at the first pressure, the cleaning process 700 continues the injection of the supercritical fluid at the first pressure level for a first specified amount of time (block 710). The first specified amount of time, like the first pressure, is dependent upon the properties of the supercritical fluid and the semiconductor substrate. The first specified amount of time can vary depending upon several factors, including but not limited to: the mechanical hardness or toughness of the semiconductor substrate (the harder the semiconductor substrate, a greater first amount of time may be permitted), the size of existing pores and imperfections on and in the semiconductor substrate (the smaller the size of the existing pores and imperfections, a greater first amount of time may be permitted), the permeability of the supercritical fluid to the semiconductor substrate (the less the permeability, a greater first amount of time may be permitted), and so forth. Note also that even if the properties of the supercritical fluid and the semiconductor substrate may allow a greater first specified amount of time, if the resulting cleaning is sufficient, it may not be necessary to increase the first specified amount of time.

The application of the supercritical fluid at a first pressure level that is typically significantly lower than a normal injection pressure when using a supercritical fluid for a specified amount of time that may result in the infusion of molecules of the supercritical fluid into the material of the semiconductor substrate, particularly into the pores and imperfections of the semiconductor substrate. The infusion of these molecules into the semiconductor substrate may then function as buffers and temporary fillers to strengthen the structure of the porous material and dampen the impact of subsequently injected supercritical fluid when it is injected at higher pressures.

Once the cleaning process 700 completes the application of the supercritical fluid at the first pressure level for the first specified period of time, the cleaning process 700 increases the injection pressure (block 715) of the supercritical fluid to a pressure level that may be on par with typical pressure levels when using the particular supercritical fluid. The cleaning process 700 applies the supercritical fluid at the increased injection pressure for a second specified period of time (block 720). Once again, the increased injection pressure and the duration of the second period of time may depend on the properties of the supercritical fluid and the semiconductor substrate material. Additionally, the desired cleanliness of the semiconductor substrate can have an effect upon the increased injection pressure and the duration of the second period of time.

According to an alternative embodiment of the present invention, rather than having two distinct injection pressures with two distinct periods of time, the cleaning process 700 may be changed to use a plurality of injection pressures, each with its own injection time. According to yet another preferred embodiment of the present invention, the cleaning process 700 may also be changed to continually increase the injection pressure, from a first injection pressure to a final injection pressure. The increasing rate of the injection pressure can be varied according to the properties of the supercritical fluid and the semiconductor substrate material.

With reference to FIG. 8, there is shown a semiconductor substrate cleaning processor 800 for use in cleaning semiconductor substrates using supercritical fluids, wherein the supercritical fluids can be injected at a variety of pressure levels, according to a preferred embodiment of the present invention. The semiconductor substrate cleaning processor 800 is essentially similar to the semiconductor cleaning processor 100 (FIG. 1) with the inclusion of several changes. The changes include a variable pressure pump 810 that will permit the changing of the injection pressure of the supercritical fluid. An additional change includes a programmable end-point detection device 840. The programmable end-point detection device 840 permits the detection of a plurality of different end-points during the cleaning process. This may permit the semiconductor substrate cleaning processor 800 to detect when to change the injection pressure from one pressure level to another.

Figure 9:
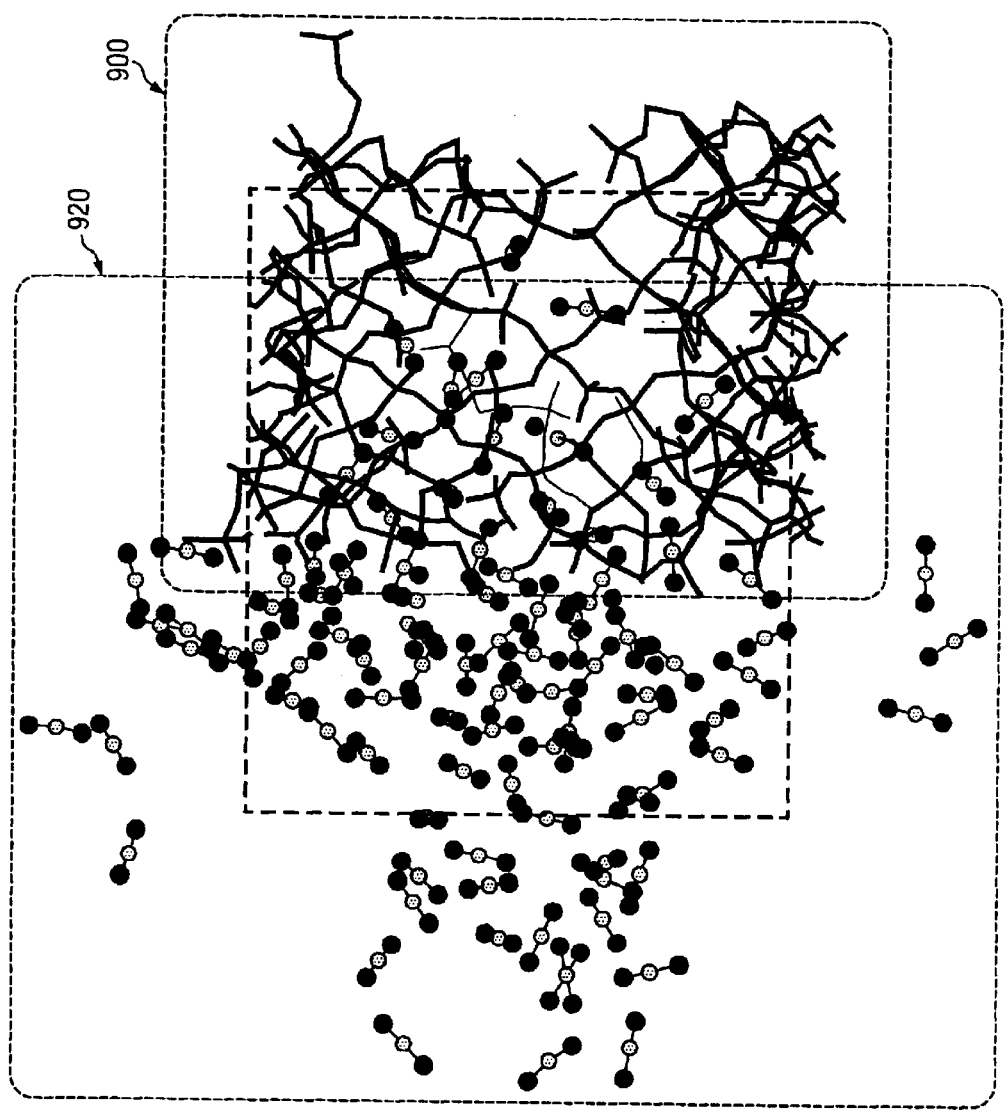
FIG. 9 is a diagram illustrating a microscopic view of a semiconductor substrate after the impact of a supercritical fluid wherein the supercritical fluid is initially injected at a lower pressure level, according to a preferred embodiment of the present invention.

With reference now to FIG. 9, there is shown a microscopic model displaying a semiconductor substrate 900 and molecules 920 of a supercritical fluid at a time after the injection pressure of the supercritical fluid has been increased to a final pressure level, according to a preferred embodiment of the present invention. FIG. 9 displays minor damage to the crystalline structure of the semiconductor substrate 900 and minor enlargement of existing pores and imperfections. However, when compared to FIG. 5b, the crystalline structure of the semiconductor substrate 900 has suffered less damage than the crystalline structure of the semiconductor substrate 550 (FIG. 5b). Note that the results displayed in FIGS. 9 and 5b were derived from computer simulation results. For example, FIG. 9 displays the results of a simulation using a semiconductor substrate with 20 Angstrom pores and carbon dioxide as a supercritical fluid that is injected at an initial pressure level of approximately 50 pounds per square inch (psi).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for cleaning a semiconductor substrate comprising:

providing a semiconductor substrate comprising materials having a low dielectric coefficient in a process chamber;

providing a fluid tank containing a supercritical fluid;

providing a pump coupled to the fluid tank;

using said pump, applying said supercritical fluid to the surface of said substrate within said process chamber at a first pressure lower than the critical pressure for the supercritical fluid for a first time period; and subsequently applying said supercritical fluid to the surface of said substrate within said process chamber at a second pressure for a second time period, wherein the second pressure is greater than the critical pressure for said supercritical fluid.

2. The method of claim 1, wherein the semiconductor substrate is selected from the group consisting of silicon and gallium arsenide.

3. The method of claim 1, wherein the supercritical fluid is carbon dioxide.

4. The method of claim 1, wherein the semiconductor substrate has pores and imperfections, and wherein the first pressure and the first time period are determined by the size of the pores and imperfections and the pores and imperfections are infused with molecules of the supercritical fluid as it is applied to the substrate at the first pressure for the first time period.

5. The method of claim 1, wherein the first period and second time period are determined by physical and chemical characteristics of the semiconductor substrate.

6. The method of claim 1, wherein the supercritical fluid is applied at increasing pressures from the first pressure up to the second pressure.

7. The method of claim 1, and further comprising the steps of:

providing a heater coupled to said pump; and heating the supercritical fluid to a temperature above room temperature prior to applying it to the surface of said semiconductor substrate.

8. The method of claim 1 and further comprising the steps of:

providing a co-solvent; and applying said co-solvent to the surface of said semiconductor substrate concurrently with said supercritical fluid.

9. The method of claim 1 wherein the first pressure is about 50 pounds per square inch.

10. The method of claim 3, wherein the second pressure is above 1072 pounds per square inch, the critical pressure for carbon dioxide.

11. The method of claim 5, wherein the semiconductor substrate has pores and imperfections, and wherein the first time period and second time period are determined by the size of the pores and imperfections.

12. A method of cleaning a semiconductor substrate comprising a low dielectric constant material, comprising the steps of:

providing a process chamber for receiving said semiconductor substrate;

providing a supercritical cleaning fluid chamber for containing a supercritical fluid comprising carbon dioxide;

providing a pump coupled to said supercritical cleaning fluid chamber for supplying said supercritical fluid to said process chamber at a variety of pressures;

applying said supercritical fluid to a surface of said semiconductor substrate within said process chamber by pumping said supercritical fluids at a first pressure for a first time period, the first pressure being less than the critical pressure for the carbon dioxide; and applying said supercritical fluid to said surface of said semiconductor substrate within said process chamber by pumping said supercritical fluid at a second pressure for a second time period, the second pressure being greater than the critical pressure for carbon dioxide, the supercritical fluid being in a supercritical state.

13. The method of claim 12, wherein the substrate has pores and imperfections, and wherein during the first time period the molecules of the supercritical fluid infuse into the pores and imperfections of the substrate.

14. The method of claim 12, wherein the first pressure is about 50 pounds per square inch.

* * * * *